(12) United States Patent
Kim et al.

(10) Patent No.: US 11,437,544 B2
(45) Date of Patent: Sep. 6, 2022

(54) PIXEL FOR MICRO DISPLAY AND METHOD OF MANUFACTURING THE SAME

(71) Applicant: SUNDIODE KOREA, Gwangju (KR)

(72) Inventors: James Chinmo Kim, San Jose, CA (US); Sungsoo Yi, Sunnyvale, CA (US)

(73) Assignee: SUNDIODE KOREA

( * ) Notice: Subject to any disclaimer, the term of this patent is extended or adjusted under 35 U.S.C. 154(b) by 367 days.

(21) Appl. No.: 16/742,909

(22) Filed: Jan. 14, 2020

(65) Prior Publication Data

US 2021/0111306 A1    Apr. 15, 2021

(30) Foreign Application Priority Data

Oct. 15, 2019  (KR) .................. 10-2019-0127506

(51) Int. Cl.
| | | |
|---|---|---|
| *H01L 33/08* | (2010.01) | |
| *H01L 33/32* | (2010.01) | |
| *H01L 33/14* | (2010.01) | |
| *H01L 33/06* | (2010.01) | |
| *H01L 27/15* | (2006.01) | |
| *H01L 33/24* | (2010.01) | |
| *H01L 33/00* | (2010.01) | |

(52) U.S. Cl.
CPC .............. *H01L 33/08* (2013.01); *H01L 27/15* (2013.01); *H01L 33/0075* (2013.01); *H01L 33/06* (2013.01); *H01L 33/145* (2013.01); *H01L 33/24* (2013.01); *H01L 33/325* (2013.01)

(58) Field of Classification Search
CPC ...... H01L 33/08; H01L 27/15; H01L 33/0075; H01L 33/06; H01L 33/145; H01L 33/24; H01L 33/325; H01L 27/156; H01L 33/002; H01L 33/005; H01L 33/20; H01L 33/26; H01L 2924/1033
See application file for complete search history.

(56) References Cited

U.S. PATENT DOCUMENTS

| | | | |
|---|---|---|---|
| 7,623,560 B2 † | 11/2009 | El-Ghoroury | |
| 7,767,479 B2 † | 8/2010 | El-Ghoroury | |
| 7,829,902 B2 † | 11/2010 | El-Ghoroury | |
| 8,049,231 B2 † | 11/2011 | El-Ghoroury | |
| 8,243,770 B2 † | 8/2012 | El-Ghoroury | |
| 8,567,960 B2 † | 10/2013 | El-Ghoroury | |
| 8,912,017 B2 † | 12/2014 | El-Ghoroury | |
| 9,985,174 B2 † | 5/2018 | El-Ghoroury | |
| 10,418,516 B2 † | 9/2019 | El-Ghoroury | |
| 11,063,179 B2 † | 7/2021 | El-Ghoroury | |
| 2014/0167067 A1 * | 6/2014 | Choi | H01L 33/32 438/46 |
| 2016/0111594 A1 * | 4/2016 | Nagel | H01L 33/08 257/13 |
| 2017/0338275 A1 * | 11/2017 | Banna | H01L 27/156 |
| 2019/0229149 A1 * | 7/2019 | Yoo | H01L 33/30 |

\* cited by examiner
† cited by third party

*Primary Examiner* — Mohammed R Alam
(74) *Attorney, Agent, or Firm* — Renaissance IP Law Group LLP

(57) ABSTRACT

Disclosed are a unit pixel of a microdisplay and a method of manufacturing the same. In the unit pixel, each of the sub-pixels forming blue, green, and red light is vertically stacked on the growth substrate. As a result, the area of a unit pixel may be reduced, and transfer processes may be facilitated.

22 Claims, 3 Drawing Sheets

PIXEL FOR MICRO DISPLAY AND METHOD OF MANUFACTURING THE SAME

TECHNICAL FIELD

The present disclosure is related to a pixel structure of a microdisplay, more particularly to a structure in which sub-pixels are vertically stacked in one pixel and a manufacturing method thereof.

BACKGROUND ART

Microdisplay is a next generation display device that is being actively developed by many display manufacturers. A pixel in a micro-display is composed of sub-pixels, and the sub-pixels emit red light, green light, and blue light. A sub-pixel emitting a specific color has the structure of a light emitting diode (LED). That is, since the LED in a sub-pixel emits a specific color, an advantage is that no backlight is required, unlike a liquid crystal display (LCD). In addition, since the LED constituting a sub-pixel is made of inorganic materials, it has very high reliability and stability. In addition, it is possible to obtain very clear images at a smaller power consumption level compared to an OLED display. Further, since LEDs are manufactured using conventional MOCVD processes of thin film growth and thus make it possible to manufacture displays of various shapes, they are very advantageous for reducing the thickness of a display.

In order to realize a full-color pixel in a micro-display, sub-pixels need to be disposed laterally spaced apart on a display substrate, and at least three sub-pixels need to be disposed on the same plane.

The arrangement of three sub-pixels on the same plane to form a pixel is a conventional approach and is the current technology used in LCDs and OLEDs. While this arrangement is also expected to be applied to a microdisplay, there are problems for this conventional approach applied to microdisplays, thus presenting a very serious obstacle in developing microdisplays.

First, the conventional pixel formation technique is very disadvantageous for a transfer process. The compound semiconductor grown on a substrate must be diced into chips through an isolation process and transferred onto a display substrate. That is, the pick and place process is essential for manufacturing microdisplays, and this process is referred to as the transfer process. Three transfer processes are required to form one pixel. That is, a red LED, a green LED, and a blue LED need to be transferred onto a display substrate separately. Because a sub-pixel needs to have a size of about 10 µm, it is challenging to move and place such a small LED at a specific position on a display substrate, and it is also very burdensome to repeat the process three times for a single pixel.

Second, the conventional pixel formation technique has a problem in that the size of the pixel needs to be increased when a black matrix is used. Like a conventional LCD display which needs a black matrix for preventing color interference between sub-pixels that control color, sub-pixels of a microdisplay also need a black matrix. In particular, because a sub-pixel of a micro-display composed of an LED that has a light generating layer in a multi-quantum well structure emits much of the light in the side direction due to crystallographic characteristics, without a black matrix, a desired color may not be achieved due to significant mixing between sub-pixels or even pixels. Therefore, it may be necessary to introduce a black matrix to prevent light mixing between sub-pixels. As mentioned, an LED that forms a sub-pixel has high intensity light emitted in the side direciton due to the crystallographic property of the active layer. In the case of a blue LED, light tends to emit in a direction perpendicular to the c-axis direction due to an inherent characteristics of the LED. The intensity of such side-emitted light is very high compared to other displays such as an LCD display or an OLED display. Therefore, in order to avoid mixing of light between adjacent sub-pixels, a thick black matrix needs to be formed, and a thick matrix causes an increase in distance between sub-pixels. Because of the increased spacing between sub-pixels, overall pixel size increases and resolution of a display decreases.

Third, it is difficult to repair a failed sub-pixel. If just one pixel out of the entire pixels in a display is defective, the display is determined to be defective. That is, even if a display has all other pixels which are normal, the display is still determined to be defective due to the defect appearing in the one pixel out of millions of pixels. Since a microdisplay essentially uses a process of transferring sub-pixels, it is possible to replace defective sub-pixels. Replacement of defective sub-pixels is known as a repair process. Once sub-pixels are transferred onto a display substrate, a repair process may be performed when an error occurs in the contacts between substrate and sub-pixels or placement of the sub-pixels. That is, in order to correct errors in the placement of sub-pixels, erroneous sub-pixels and sub-pixels in the neighboring region may be selectively removed from the display substrate, and a new set of sub-pixels may be disposed. However, in a structure with horizontally laid out red, green, and blue sub-pixels, it is very difficult to selectively and precisely remove a sub-pixel and subsequently newly place a new sub-pixel. In order to solve this problem, a process of removing a large block of pixels and transferring a new block may be considered, but the process of picking and placing a block of sub-pixels is also not straightforward. This is due to inherent characteristics of the transfer process, which is that sub-pixels can be transferred relatively easily onto an initially empty display substrate with no sub-pixels that have been placed, and the placement of new sub-pixels between already existing sub-pixels is not easy.

Accordingly, a pixel structure that can be easily implemented in a small size without having to implement sub-pixels on the same plane to realize high resolution and can simplify a transfer process is highly desired.

DISCLOSURE

Technical Problem

A first aspect of the present inventive concept is to provide a pixel structure of a microdisplay having vertically stacked sub-pixels.

A second aspect of the present inventive concept is to provide a method of manufacturing a pixel of a microdisplay for achieving the first aspect of the present inventive concept.

Technical Solution

The first aspect of the present inventive concept provides a unit pixel of a microdisplay comprising, a first sub-pixel formed on a growth substrate and configured to emit light of a first wavelength, a common anode layer formed on the first sub-pixel and having n-type GaN, a second sub-pixel formed on the common anode layer and emitting light of a second wavelength that is longer than the first wavelength, a current blocking layer formed on the second sub-pixel and having a GaN-based compound semiconductor, and a third sub-pixel formed on the current blocking layer that emits light of a third wavelength that is longer than the second wavelength.

The second aspect of the present inventive concept provides a method of manufacturing a unit pixel of a microdisplay comprising, forming a first sub-pixel on a growth substrate to emit light of a first wavelength by using a GaN-based compound semiconductor, forming a common anode layer having GaN on the first sub-pixel, forming a second sub-pixel having GaN on the common anode layer and emitting light of a second wavelength that is longer than the first wavelength, forming a current blocking layer having GaN on the second sub-pixel for blocking leakage current from or toward the second sub-pixel, and forming a third sub-pixel having GaN on the current blocking layer and emitting light of a third wavelength that is longer than the second wavelength.

Advantageous Effects

According to the present inventive concept, a unit pixel includes at least three sub-pixels stacked vertically. The anodes of all the sub-pixels are commonly connected to a single terminal, and current flowing through each of the sub-pixels is controlled independently. In addition, a unit pixel is grown using an one-step process in-situ. This is a process with very high productivity.

In addition, the present inventive concept has a great advantage over the conventional method of implementing a unit pixel by arranging a red LED, a green LED, and a blue LED horizontally on a substrate. Three separate transfer processes are required to place each LED on the display substrate. For example, after placing red LEDs on a display substrate, green LEDs and blue LEDs should be placed in order. However, in the present inventive concept, since a single pixel includes all of the red, green, and blue light sources, producing a microdisplay using a single transfer process for each pixel is possible.

In addition, when the conventional method is used in a transfer process, each LED constituting a sub-pixel has a high aspect ratio. For example, when a pixel having an overall size of 50 μm is to be formed, each sub-pixel should be horizontally disposed, and thus the size of a sub-pixel should have a size of about 10 μm or less. Transferring LEDs of size less than 10 μm is not easy. On the other hand, in the present inventive concept, since the sub-pixels are stacked vertically, the size of a pixel to be transferred can be as large as 40 μm, making a transfer process more facile.

In addition, a large effective pixel area is required when sub-pixels are arranged horizontally, and color mixing is not natural, but in the present inventive concept, since the sub-pixels are arranged vertically, color mixing is easy, and thus the display is very easy to implement.

MODES OF THE INVENTION

Figure 1:
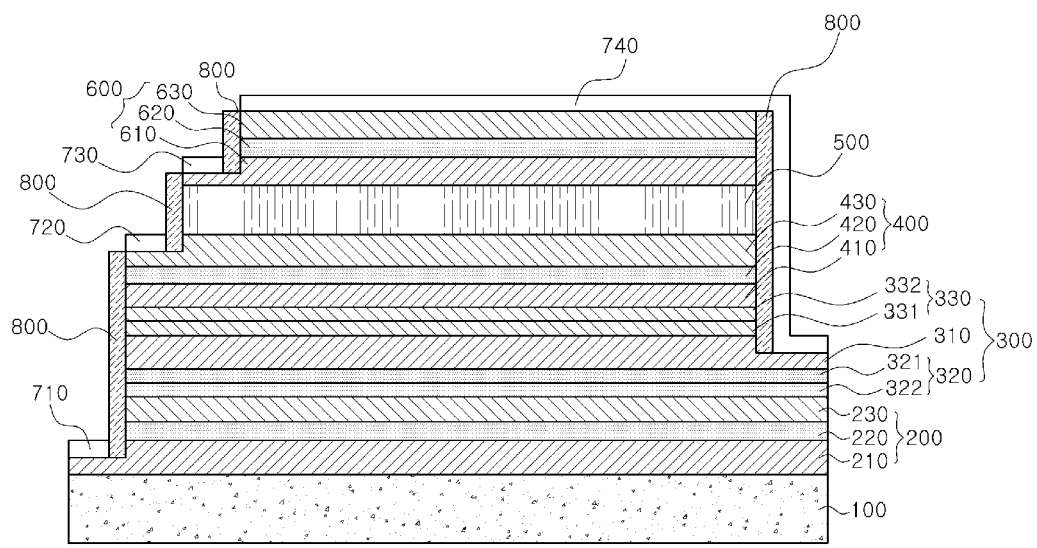
FIG. 1 is a cross-sectional view of a pixel of a micro display according to a preferred embodiment of the present inventive concept.

Hereinafter, embodiments of the present inventive concept will be described in detail with reference to the accompanying drawings.

While the present inventive concept is susceptible to various modifications and alternative forms, specific embodiments thereof are shown by way of example in the drawings and will herein be described in detail. However, it should be understood that there is no intent to limit the invention to the particular forms disclosed but rather the invention is to cover all modifications, equivalents, and alternatives falling within the spirit and scope of the invention defined by the appended claims.

When an element such as a layer, a region, and a substrate is referred to as being disposed "on" another element, it should be understood that the element may be directly formed on the other element or an intervening element may be interposed therebetween.

It should be understood that, although the terms "first," "second," etc. may be used herein to describe various elements, components, areas, layers, and/or regions, these elements, components, areas, layers, and/or regions are not limited by these terms.

Embodiment

FIG. 1 is a cross-sectional view of a pixel of a microdisplay according to a preferred embodiment of the present inventive concept.

Referring to FIG. 1, the pixel of a microdisplay has a first sub-pixel 200 formed on a growth substrate 100, a common anode layer 300, a second sub-pixel 400, a current blocking layer 500 and a third sub-pixel 600.

The first sub-pixel 200 is formed on the growth substrate 100 and emits light of a first wavelength. The growth substrate 100 corresponds to materials used in a typical LED manufacturing process, and sapphire is preferable.

The first sub-pixel 200 has a first n-type semiconductor layer 210 formed on the growth substrate 100, a first active layer 220 and a first p-type semiconductor layer 230. The first n-type semiconductor layer 210 preferably has GaN, and Si is used as a dopant. In addition, the first p-type semiconductor layer 230 may be formed of GaN, and Mg may be used as a dopant. The first active layer 220 has a multi-quantum well structure, and preferably emits blue light. Therefore, the first active layer 220 of the first sub-pixel 200 may perform light emission by having the bandgap adjusted according to a change in the fraction of In (indium), in $In_xGa_{1-x}N$.

The common anode layer 300 is formed on the first sub-pixel 200. Since the common anode layer 300 is also grown based on a GaN single crystal, the common anode layer 300 may be manufactured in-situ with the first sub-pixel 200. The common anode layer 300 has a first anode layer 310, a first tunnel junction layer 320 and a second tunnel junction layer 330 respectively disposed above and below the first anode layer 310. The first anode layer 310 has GaN doped as n-type. Since n-type GaN has higher conductivity than p-type GaN, the n-type GaN has an advantage of being able to supply current evenly over the entire surface of the first sub-pixel 200 and the second sub-pixel 400.

The first tunnel junction layer 320 is composed of GaN-based compound semiconductors, and formed between the first anode layer 310 and the first p-type semiconductor layer 230 of the first sub-pixel 200. The first tunnel junction layer 320 includes a first highly n-doped layer 321 and a first highly p-doped layer 322. The first highly n-doped layer 321 is formed in contact with the first anode layer 310 which is n-type GaN, and the first highly p-doped layer 322 is formed between the first highly n-doped layer 321 and the first highly p-doped layer 230.

The first highly n-doped layer 321 of the first tunnel junction layer 320 has the same conductivity type as the first anode layer 310, and the first highly p-doped layer 322 has the same conductivity type as the first p-type semiconductor layer 230. In addition, the first anode layer 310 and the first p-type semiconductor layer 230 are in a reverse bias state. The current flowing from the first anode layer 310 that is n-type GaN layer may be evenly transferred to the first p-type semiconductor layer 230 by the first tunnel junction layer 320. Tunneling in a tunnel junction refers to a phenomenon in which electrons, instead of moving within the conduction band, move to the valence band on the other side of a very narrow depletion region (i.e., "tunnel through") that forms a high-energy barrier for the electrons due to high doping. Accordingly, due to the very narrow width of the depletion region, tunneling may occur even at a relatively low voltage, and a high density of charges may move from the first anode layer 310 to the first p-type semiconductor layer 230.

In addition, the first highly n-doped layer 321 may be omitted from the first tunnel junction layer 320.

The second tunnel junction layer 330 is composed of GaN-based compound semiconductors and formed on the first anode layer 310. The second tunnel junction layer 330 has a second highly n-doped layer 331 formed on the first anode layer 310 and second highly p-doped layer 332 formed on the second highly n-doped layer 331. Since the first anode layer 310 is made of n-type GaN, the second highly n-doped layer 331 has continuity of the growth of the same material and can be easily formed. In addition, the second highly p-doped layer 332 formed on the second n-type high doping layer 331 is also used as a template for the growth of the second sub-pixel 400.

The second sub-pixel 400 is formed on the common anode layer 300. The second sub-pixel has a second p-type semiconductor layer 410 formed on the common anode layer 300, a second active layer 420, and a second n-type semiconductor layer 430.

The second sub-pixel 400 is formed using GaN-based compound semiconductors. In addition, the second active layer 420 formed on the second p-type semiconductor layer 410 may emit light having a second wavelength and may emit a wavelength longer than the first wavelength. Accordingly, the second active layer 420 has a multi-quantum well structure, and the fraction of In forming the well layers is higher than the fraction of In included in the well layers of the first active layer 420. For example, the second active layer 420 may emit green light.

In addition, the second p-type semiconductor layer 410 is a GaN-based compound semiconductor, and Mg is used as a dopant. The second n-type semiconductor layer 430 is formed on the second active layer 420 and is a GaN-based compound semiconductor, and Si is used as a dopant.

The sequence of layers forming the second sub-pixel 400 has a special aspect that is different from the first sub-pixel 200. That is, since the first sub-pixel 200 is formed by using an epitaxial growth technique based on the growth substrate 100, the first n-type semiconductor layer 210 is formed first. However, the second sub-pixel 400 is formed on the first sub-pixel 200 and is grown using the common anode layer 300 as the base layer. This is due to the fact the common anode layer 300 is composed of GaN-based compound semiconductors. Since the voltage transmitted through the common anode layer 300 should be applied to the first sub-pixel 200 and the second sub-pixel 400, the second p-type semiconductor layer 410 is formed first on the common anode layer 300.

In addition, since the second highly p-doped layer 332, which is the uppermost layer of the common anode layer 300, is GaN heavily doped with Mg as a dopant, it facilitates the growth of the second p-type semiconductor layer 410. Therefore, since the first sub-pixel 200, the common anode layer 300, and the second sub-pixel 400 are composed of single crystals of compound semiconductors having GaN, an in-situ process is possible.

The current blocking layer 500 is formed on the second sub-pixel 400. The current blocking layer 500 may block a current that may flow from the second sub-pixel 400 to the third sub-pixel 600 or may flow from the third sub-pixel 600 to the second sub-pixel 400. In order for current flows between the semiconductor layers to be blocked, the current blocking layer 500 needs to have a high resistance or be reverse biased with respect to the contacting semiconductor layer. For example, since the second n-type semiconductor layer 430 and the third n-type semiconductor layer 610 are in contact with the current blocking layer 500, the current blocking layer 500 may be a p-type semiconductor layer. In addition, the current blocking layer 500 may be formed of an insulator made of GaN containing a transition metal as a dopant.

Therefore, the current blocking layer 500 is preferably composed of Mg-doped GaN or Fe-doped GaN. In addition, the current blocking layer 500 is preferably formed of p-type GaN. A GaN layer grown by using MOCVD process has an n-type conductivity type even without any specific dopant introduced during the GaN growth, due to native defects present in intrinsic GaN. This is because defects in the GaN crystal increases electron concentration. For example, undoped GaN has an n-type conductivity and has a sheet resistance of 3 k$\Omega$/□. In addition, when Mg is doped, deep level acceptors are formed to increase the ionization energy of the dopant. Therefore, the formed current blocking layer 500 has a very high resistance. In addition, when Fe is doped, Fe atoms also act as deep level acceptors and can achieve very high resistance.

For example, at a Fe concentration of $1.7 \times 10^{18}$ cm$^{-3}$ in Fe-doped GaN, the sheet resistance has a value of 200 k$\Omega$/□. Accordingly, the doping concentration of Fe in the current blocking layer 500 is preferably $1 \times 10^{19}$ cm$^{-3}$ or more. The thickness of the current blocking layer 500 is 100 nm or more and needs to be 1 um or less. If the thickness of the current blocking layer 500 is less than 100 nm, a sufficient resistance value cannot be obtained, and if it exceeds 1 um, an increase in growth time results in a decrease in productivity.

In addition to Fe, a transition metal such as Mn, Co, Ni, or Cu may be used as a dopant since they act as deep level acceptors.

Furthermore, the current blocking layer 500 may have p-type conductivity and may contact the second n-type semiconductor layer 430 of the second sub-pixel 400. A reverse bias is formed between the second sub-pixel 400 and the current blocking layer 500, and a current from the second sub-pixel 400 toward the current blocking layer 500 is blocked by the reverse bias.

The third sub-pixel 600 is formed on the current blocking layer 500. The third sub-pixel 600 has a third n-type semiconductor layer 610 formed on the current blocking layer 500, a third active layer 620, and a third p-type semiconductor layer 630.

The third sub-pixel 600 is composed of GaN-based compound semiconductors, and the third active layer 620 emits light having a third wavelength that is longer than the second wavelength. To this end, the well layer constituting the third active layer 620 preferably has In (indium) at a higher fraction than the well layer of the second active layer 420. The third active layer 620 preferably has a quantum well structure in which barrier layers and well layers are alternately formed. However, the number of well layers is preferably no more than three The third active layer 620 emits light having a third wavelength and preferably emits red light.

In addition, a third p-type semiconductor layer 630 is formed on the third active layer 620.

The third n-type semiconductor layer 610 has GaN, and Si is used as a dopant. The third p-type semiconductor layer 630 may be formed of GaN, and Mg may be used as a dopant. In particular, the third n-type semiconductor layer 610 may be formed on the current blocking layer 500 because the current blocking layer 500 is formed based on the compound semiconductor of GaN.

In the present embodiment, the first sub-pixel 200, the common anode layer 300, the second sub-pixel 400, the current blocking layer 500, and the third sub-pixel 600 are all GaN-based compound semiconductors. Thus, an in-situ process enabling one-step growth of the whole structure is possible in the same growth chamber. Therefore, high productivity can be ensured.

In addition, a leakage current that may flow from the third n-type semiconductor layer 610 to the second n-type semiconductor layer 430 is prevented by the current blocking layer 500. That is, the third sub-pixel 600 may perform an independent light emission operation without being affected by the second sub-pixel 400 because of the current blocking layer 500.

A first negative electrode 710 is formed on the first n-type semiconductor layer 210, a second negative electrode 720 is formed on the second n-type semiconductor layer 430, and a third negative electrode 730 is formed on the third n-type semiconductor layer 610. In addition, a common electrode 740 is formed on the third p-type semiconductor layer 630, and the common electrode 740 is extended to be electrically connected to the first anode layer 310. The common electrode 740 also reflects light formed in the third active layer 620 in the direction of the growth substrate 100.

In present embodiment, electrodes are formed on all n-type semiconductors. In particular, the first anode layer 310 is also made of n-type GaN and is connected to the common electrode 740. In addition, the common electrode 740 is formed only on the third p-type semiconductor layer 630 among the p-type semiconductors, and separate electrodes are not formed on the remaining p-type semiconductor layers.

All p-type semiconductor layers constituting the three sub-pixels 200, 400, and 600 are electrically connected to each other in common. In addition, the three n-type semiconductor layers constituting the three sub-pixels 200, 400, and 600 are controlled independently relative to each other.

In addition, at least one side surface of the three sub-pixels 200, 400, and 600, the common anode layer 300, and the current blocking layer 500 may be passivated by the insulating layer 800. In particular, the common electrode 740 formed on the surface of the third p-type semiconductor layer 630 and covering the third p-type semiconductor layer 630 may need to be connected to a first anode layer 310 having n-type GaN. Accordingly, the common electrode 740 is formed along the side surfaces of the third sub-pixel 600, the current blocking layer 500, the second sub-pixel 400, and the second tunnel junction layer 330 and is in contact with an exposed part of the first anode layer 310. However, since the common electrode 740 is to be electrically insulated from the third sub-pixel 600, the current blocking layer 500, the second sub-pixel 400, and the second tunnel junction layer 330, the insulating layer 800 need to be formed between the side surfaces thereof and the common electrode 740.

In addition, the light produced in the pixel of present embodiment needs to be emitted toward the growth substrate direction. To this end, the common electrode 740 functions as a reflective layer. When light having specific wavelengths produced in each of the sub-pixels 200, 400, and 600 are emitted to the outside in the third sub-pixel direction, a specific color may not be controllably formed due to light absorption. Therefore, in the present embodiment, the common electrode 740 is formed on the third sub-pixel 600, and the common electrode 740 is formed to cover all of the third sub-pixel 600.

In addition, those skilled in the art might consider forming the first p-type semiconductor layer and the second p-type semiconductor layer as one layer, eliminating the common anode layer 300. This would be a case of considering using the formed p-type layer as a common anode layer. However, when the p-type semiconductor layer is used as a common anode layer, current cannot be spread evenly over the entire plane of the first active layer 220 and the second active layer 420 due to low conductivity of the p-type semiconductor layer. Therefore, in the present inventive concept, a bias is applied to the first anode layer 310 which is n-type GaN via the common electrode 740. Since n-type GaN has high conductivity, current can be spread evenly over the entire plane. In addition, when the first p-type semiconductor layer 230 of the first sub-pixel 200 and the second p-type semiconductor layer 410 of the second sub-pixel 400 are in direct contact with the first anode layer 310 which is n-type GaN, the resulting reverse bias requires a very high driving voltage. In order to solve this problem, tunnel junction layers 320 and 330 are provided between the first anode 310 and the p-type semiconductor layers 230 and 410 of the sub-pixels. This way, a high current may be supplied to the first active layer 210 and the second active layer 420 within a stable voltage range.

Figure 2:
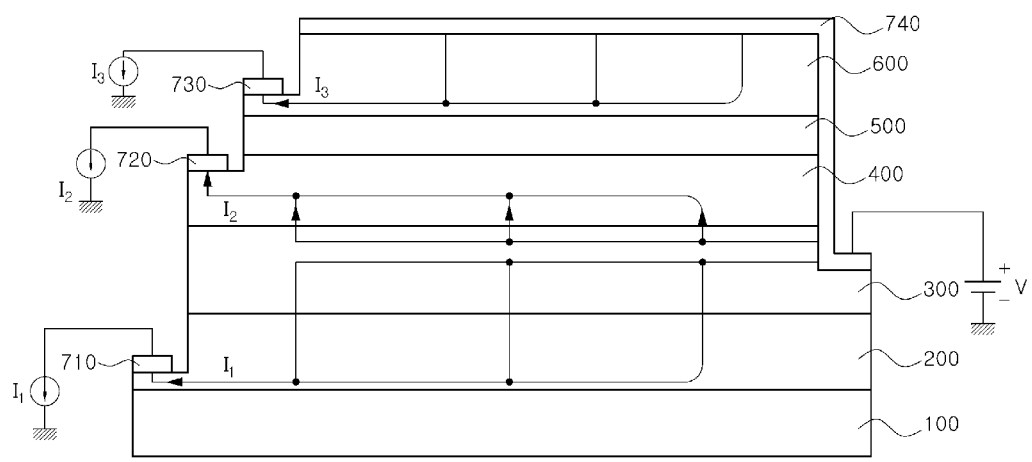
FIG. 2 is a conceptual view illustrating a light emitting operation of a pixel of the microdisplay of FIG. 1 according to a preferred embodiment of the present inventive concept.

FIG. 2 is a conceptual view illustrating a light emitting operation of a pixel of the microdisplay of FIG. 1 according to a preferred embodiment of the present inventive concept.

Referring to FIG. 2, a positive voltage is applied via the common electrode 740, and current is adjusted by the first negative electrode 710, the second negative electrode 720, and the third negative electrode 730.

The positive voltage V is applied to the common electrode 740. It is preferable that the positive voltage V applied has a constant value.

In addition, a first current source is connected to the first negative electrode 710, a second current source is connected to the second negative electrode 720, and a third current source is connected to the third negative electrode 730. The first driving current I1 by the first current source flows through the first sub-pixel 200. In addition, the second driving current I2 by the second current source flows through the second sub-pixel 400. The first driving current I1 and the second driving current I2 flow through the common anode layer 300. Respective drive currents I1 and I2 are independently controlled by current sources connected to the negative electrodes 710, 720. Therefore, the first sub-pixel 200 and the second sub-pixel 400 may perform light emission by the driving currents I1 and I2 which are independently controlled.

In addition, the third driving current I3 flows through the third sub-pixel 600 by the third current source connected to the third negative electrode 730. In particular, since the current blocking layer 500 is disposed between the second sub-pixel 400 and the third sub-pixel 600, the second driving current I2 and the third driving current I3 operate independently of each other. As a result, the third sub-pixel 600 may also perform an independent light emission operation regardless of the operation of the other sub-pixels.

Figure 3:
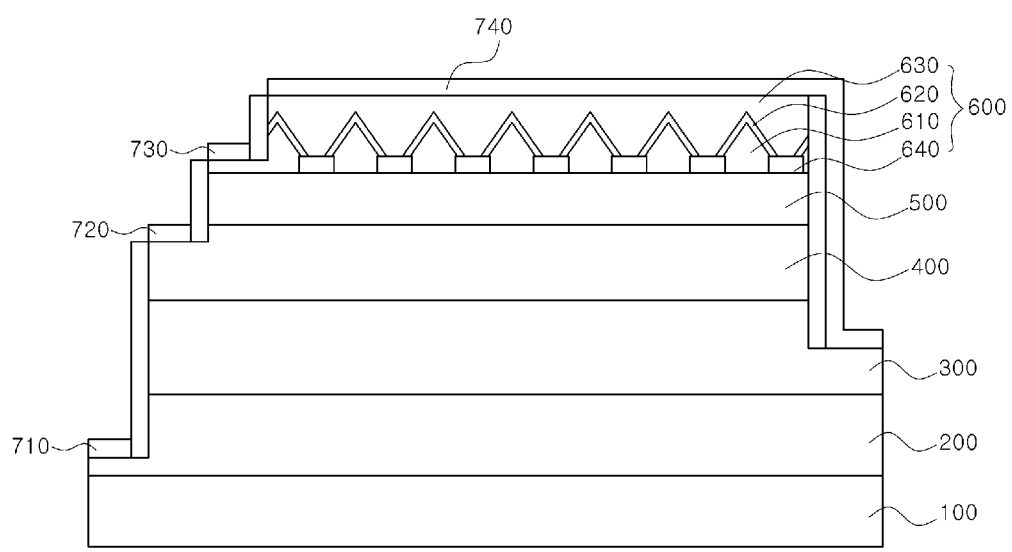
FIG. 3 is another cross-sectional view of a pixel of a microdisplay according to a preferred embodiment of the present inventive concept.

FIG. 3 is another cross-sectional view of a pixel of a micro-display according to a preferred embodiment of the present inventive concept.

Referring to FIG. 3, a pixel of a microdisplay includes a first sub-pixel 200 formed on a growth substrate 100, a common anode layer 300, a second sub-pixel 400, a current blocking layer 500, and a third sub-pixel 600.

The configuration and the material of the first sub-pixel 200, the common anode layer 300, the second sub-pixel 400, and the current blocking layer 500 are the same as those shown in FIG. 1. However, the third sub-pixel 600 formed on the current blocking layer 500 has a configuration different from that of FIG. 1.

The third sub pixel 600 has an alternating concave-convex structure grown on a textured surface thereof. The growth limiting layer 640 is formed on the current blocking layer 500 to form a textured surface. The growth limiting layer 640 is preferably composed of SiNx.

Si and N can be supplied in-situ in the MOCVD process. For example, Si is used as a dopant for n-type semiconductor layers and is supplied into the chamber in the form of a precursor such as SiH$_4$, Si$_2$H$_6$, or DTBSi (ditertiarybutylsilane). In addition, nitrogen can be supplied into the chamber using NH$_3$ as a precursor. Therefore, the formation of SiNx layers in the growth process of GaN based compound semiconductor single crystal is possible in situ.

The growth limiting layer 640 having the SiNx material may be an island type or a mesh type. The island type means that the growth limit layer 640 does not cover the entire current blocking layer 500 and is formed to have islands separated from one another on the surface. In addition, the mesh type means that the growth limiting layer 640 also does not cover the entire current blocking layer 500 and has holes exposing portions of the surface of the lower current blocking layer 500.

The third n-type semiconductor layer 610 is formed in the lateral spaces between islands or the open spaces of a mesh formed by a growth limiting layer 640 on the current blocking layers 500. The third n-type semiconductor layer 610 is made of GaN. Si is used as the dopant. That is, the Si-doped third n-type semiconductor layer 610 is characterized by the fact that the crystal structure is well matched to the GaN compound semiconductor single crystal-based current blocking layer 500 to facilitate growth. However, since the SiNx layer forming the growth limiting layer 640 has an amorphous structure, it is difficult for the third n-type semiconductor layer 610 to be easily grown directly on the growth limiting layer 640.

Accordingly, in FIG. 3, the third n-type semiconductor layer 610 is easily grown in the lateral spaces between islands or the empty spaces of a mesh formed by the growth limiting layer 640.

Subsequently, a third active layer 620 is formed on the third n-type semiconductor layer 610. The third active layer 620 preferably has a quantum well structure in which barrier layers and well layers are alternately formed. However, the number of well layers is preferably no more than 3. The third active layer 620 emits light having a third wavelength and preferably emits red light. The fraction of indium in the well layer is required to be very high for the growth of well layers emitting red light. When the fraction of indium is high, phase separation of InN and GaN occurs in the well layers that have InGaN, and emission of red light may become very difficult or the well layers may exhibit very low light-emission characteristics. Typically, an MOCVD process is performed at a high growth temperature to facilitate uniform distribution of In (indium) and Ga. However, when the growth temperature decreases to incorporate high fraction of indium in the well layer, the mobilities of In and Ga atoms are decreased and the layer is grown under the influence of the strain due to high In fraction, and aggregates of InN and GaN could form in the crystal structure. This results in a fatal side effect for realizing efficient red light emission.

In order to prevent the side effect, the third n-type semiconductor layer 610 based on GaN compound semiconductor single crystal is grown on a textured surface. In FIG. 2, the third n-type semiconductor layer 610 is formed in the lateral spaces between islands or the open spaces of a mesh formed by the growth limiting layers 510, and the upper surface of the third n-type semiconductor layer 610 is not completely planarized with respect to the surface of the lower current blocking layer 500. In particular, the third n-type semiconductor layer 610 may have a more sharply pointed shape than the surface of the growth limiting layer 640. Accordingly, the third n-type semiconductor layer 610 is formed in the lateral spaces between islands or the open spaces of a mesh formed by the growth limiting layer 640, and has a shape protruding from the surface of the growth limiting layer 640.

A third active layer 620 is formed on the third n-type semiconductor layer 610. The third active layer 620 also has a GaN-based compound semiconductor single crystal structure. Further, since the well layer has a very high fraction of In (indium), there is a possibility that the In (indium) in the well layer is phase-separated under the influence of strain in the crystal structure to form aggregates of InN and aggregates of GaN. However, in the present inventive concept, the strain of the third active layer 620 formed on the surface of the third n-type semiconductor layer 610 is substantially reduced due to the protruding structure of the third n-type semiconductor layer 610 which allows the light emitting layer to expand laterally to relieve strain. As the content of In (indium) increases in the crystal structure of InGaN, the lattice constant of the crystal structure increases. Increasing the lattice constant may cause strain in the crystal structure. In order to prevent this, the third n-type semiconductor layer 610 has an inclined shape and acts as a strain-relieving layer, and mitigates aggregation of InN. As a result, In (indium) atoms may be uniformly distributed in the GaN crystal structure, and a red light emission operation may be performed.

In addition, it is preferable that one to three well layers are formed in the third active layer 620. If the well layer is formed with a number greater than three, defects in the crystal structure may increase and the quality of a film may decreases.

The third p-type semiconductor layer 630 is formed on the third active layer 620. The third p-type semiconductor layer 630 is composed of a GaN-based compound semiconductor.

In FIG. 3, the third n-type semiconductor layer 610 is shown to be grown only in the lateral spaces between islands or the open spaces of a mesh formed by the growth limiting layers 640, but a part of the third n-type semiconductor layer 610 may be formed on the growth limiting layer 640 depending on the MOCVD process. That is, a portion of the third n-type semiconductor layer 610 may be formed on the growth limiting layer 640 through lateral growth. In addition, since the third active layer 620 is formed along the textured surface of the third n-type semiconductor layer 610, the third active layer 620 may also be formed on the third n-type semiconductor layer 610 formed on the growth limiting layer 640. However, the third n-type semiconductor layer 610 needs to have textured surface.

The first negative electrode 710 is formed on the first n-type semiconductor layer, and the common electrode 740 is formed on the first anode layer. In addition, a second negative electrode 720 is formed on the second n-type semiconductor layer, and a third negative electrode 730 is formed on the third n-type semiconductor layer 610. In addition, a common electrode 740 is formed on the third p-type semiconductor layer 630.

That is, the driving currents flowing through the three sub-pixels can be adjusted independently by fixing the voltage at the common electrode 740 and by controlling the voltage or the current at each of the three negative electrodes 710, 720, and 730.

Figure 4:
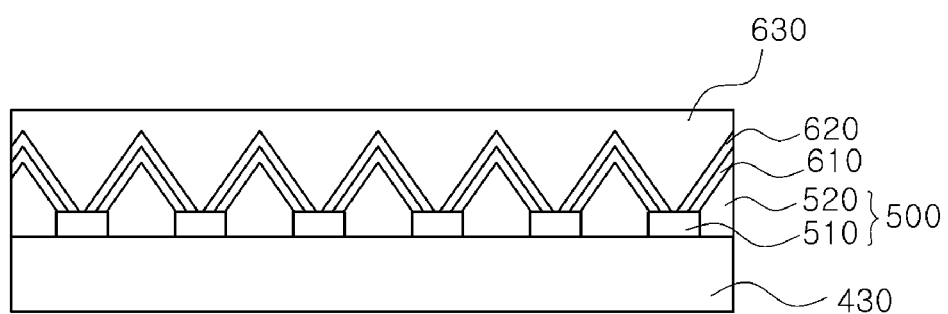
FIG. 4 is still another cross-sectional view illustrating a current blocking layer and a third sub-pixel according to a preferred embodiment of the present inventive concept.

FIG. 4 is still another cross-sectional view illustrating a current blocking layer and a third sub-pixel according to a preferred embodiment of the present inventive concept.

Referring to FIG. 4, the configurations of the first sub-pixel, the common anode layer, and the second sub-pixel under the current blocking layer 500 are the same as those described with reference to FIG. 1.

The current blocking layer 500 has a growth limiting layer 510 and a blocking semiconductor layer 520 formed in the lateral spaces between islands or open spaces of a mesh formed by the growth limiting layers 510. The growth limiting layer 510 is a SiNx material.

To form the growth limiting layer 510, while Ga source for GaN growth is blocked in the MOCVD process, NH3 is supplied into the chamber while also supplying Si. As a result, a growth limiting layer 510 of SiNx material is formed. The growth limiting layer 510 is not uniformly formed on the second n-type semiconductor layer 430 of the second sub-pixel and may aggregate to form a mesh or islands. As a result, the growth limiting layer 510 may expose a portion of the GaN layer of the lower second sub-pixel.

Subsequently, the blocking semiconductor layer 520 is grown based on the portion exposed by the growth limiting layer 510. The blocking semiconductor layer 520 is grown by filling spaces between the lateral spaces between islands or open spaces of a mesh formed by the growth limiting layers 510. The blocking semiconductor layer 510 is preferably a GaN-based compound semiconductor and is doped with Fe or Mg, which is the same as described with reference to the current blocking layer in FIG. 1. Therefore, the blocking semiconductor layer 520 has a high resistance value, and the growth limiting layer 510 having the SiNx material also has a high resistance value, so that the current blocking layer 500 can easily block a leakage current between the second sub-pixel and the third sub-pixel.

In addition, the current blocking layer 500 may include only a pair consisting of growth limiting layer and a blocking semiconductor layer and may have a plurality of pairs consisting of a growth limiting layer and a blocking semiconductor layer.

The third sub-pixel 600 is formed on the current blocking layer 500. The third sub-pixel 600 has a GaN-based compound semiconductor material. First, a third n-type semiconductor layer 610 is formed on the current blocking layer 500. The third n-type semiconductor layer 610 is grown on the blocking semiconductor layer 520 constituting the current blocking layer 500. The growth limiting layer 510 is made of SiNx and has an amorphous structure. Therefore, the GaN compound semiconductor layer of the third sub-pixel 600 may not grow based on the growth limiting layer 510. Accordingly, the third n-type semiconductor layer 610 protrudes from the surface and grows along the surface profile of the blocking semiconductor layer 520 having an inclined shape. However, when the growth conditions promoting lateral growth is used during growth of the third n-type semiconductor layer 610, the third n-type semiconductor layer 610 may be formed on the growth limiting layer 510 while having a protruding shape.

A third active layer 620 is formed on the third n-type semiconductor layer 610, and a third p-type semiconductor layer 630 is formed on the third active layer 620. The common electrode 740 is formed on the third p-type semiconductor layer 630.

In FIG. 4, the third n-type semiconductor layer 610 is in a state where strain is reduced by the structure of the current blocking layer 500. That is, the strain that may be generated in the third n-type semiconductor layer 610 is relieved by the crystal defects artificially formed in the lower portion, and the strain is reduced. Therefore, InN and GaN aggregation which may occur when the well layer is formed can be mitigated, and more efficient red-light emission can be realized.

Figure 5:
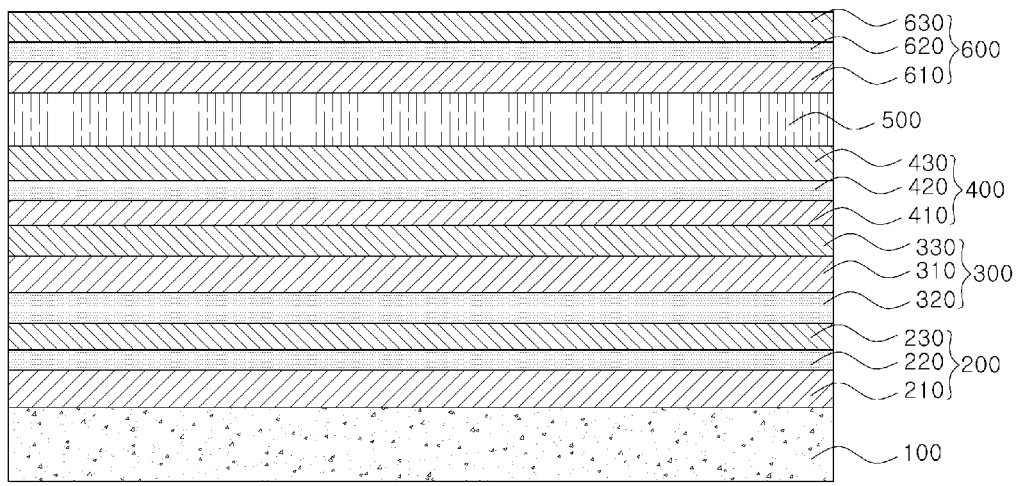
FIG. 5 and FIG. 6 are cross-sectional views illustrating a method of manufacturing the pixel of FIG. 1 according to a preferred embodiment of the present inventive concept.
Figure 6:
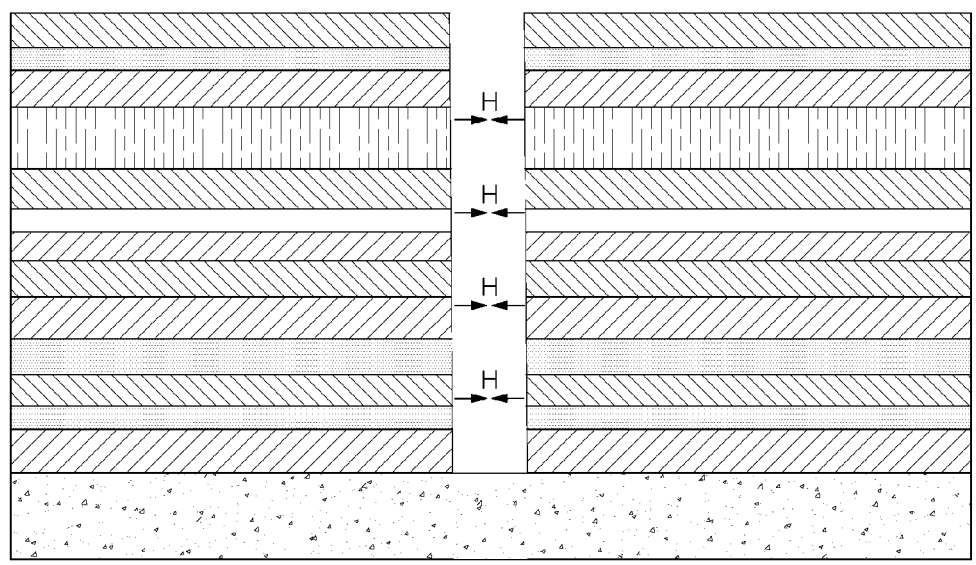

FIG. 5 and FIG. 6 are cross-sectional views illustrating a method of manufacturing the pixel of FIG. 1 according to a preferred embodiment of the present inventive concept.

Referring to FIG. 5, a first sub-pixel 200 formed on a growth substrate 100, a common anode layer 300, a second sub-pixel 400, a current blocking layer 500, and a third sub-pixel 600 are formed sequentially.

Sapphire or the like is used as the growth substrate 100, and the first sub-pixel 200 for emitting blue light on the growth substrate 100 is easily formed. Of course, a buffer layer may be formed between the first sub-pixel 200 and the growth substrate 100 to compensate for the difference in the lattice constants. The first n-type semiconductor layer 210, the first active layer 220, and the first p-type semiconductor layer 230 are sequentially formed on the growth substrate 100.

Subsequently, the common anode layer 300 is formed in situ on the first sub-pixel 200. The layers constituting the common anode layer 300 have a GaN-based compound semiconductor material. Therefore, after the first sub-pixel 200 is formed, work in a separate chamber is not required, and a common anode layer 300 may be formed in the same chamber.

For example, as described with reference to FIG. 1, the first highly p-doped layer and the first highly n-doped layer, which are heavily doped, respectively, are sequentially formed on the first p-type semiconductor layer 230. The first highly p-doped layer uses Mg as a dopant, and the first highly n-doped layer uses Si as a dopant. In addition, a first anode layer 310 is formed on the first highly n-doped layer. The first highly p-doped layer and the highly n-doped layer constitute a first tunnel junction layer 320. The first tunnel junction layer 320 may be formed in plurality. In addition, the first anode layer 310 is formed of n-type GaN. Since the first anode layer 310 having the n-type GaN material has high conductivity, current may be uniformly distributed in the first anode layer 310.

The second highly n-doped layer and the second highly p-doped layer are sequentially formed on the first anode layer 310. The second highly n-doped layer and the second highly p-doped layer constitute a second tunnel junction layer 330.

The second sub-pixel 400 is formed on the second tunnel junction layer 330. For example, the second p-type semiconductor layer 410, the second active layer 420, and the second n-type semiconductor layer 430 are sequentially formed using an MOCVD process.

The current blocking layer 500 is formed on the second n-type semiconductor layer 430. Since the current blocking layer 500 is also a GaN-based compound semiconductor, it can be grown in situ. Mg or Fe is used as the dopant for the current blocking layer 500.

Subsequently, a third n-type semiconductor layer 510, a third active layer 520, and a third p-type semiconductor layer 530 are formed on the current blocking layer 500.

Referring to FIG. 6, an isolation of pixels is performed using mesa etching. Accordingly, one pixel may be composed of three sub pixels. Isolation of the pixels may be performed by forming a photoresist pattern and etching using the formed photoresist pattern as an etch mask. Thus, a portion of the surface of the growth substrate 100 is exposed.

Subsequently, after the pixel isolation process is performed, the activation process for the p-type semiconductor layers through heat treatment is performed. The activation process is for discharging hydrogen atoms incorporated in the layers during the growth of the p-type semiconductor layers to the outside. In general, the activation process for the p-type semiconductor layer is performed before chip fabrication process. For example, in the case of a blue LED, the p-type semiconductor layer is formed as the topmost layer or at a position close to the topmost layer, and a heat treatment process is performed before forming chips through etching. This is because since the p-type semiconductor layer is disposed as or near the uppermost layer, hydrogen ions or hydrogen atoms are easily discharged through the upper side rather than being discharged through the side of the layer.

However, in FIG. 5, it is not easy to discharge hydrogen atoms to the outside by performing a heat treatment on the first p-type semiconductor layer due to the presence of the upper layers. That is, due to the presence of the upper layers and the nature of n-type semiconductor layer, hydrogen atoms do not diffuse to the outside even when separated from Mg. Therefore, in the present inventive concept, hydrogen atoms are discharged through the side surfaces of the p-type semiconductor layers after the pixel isolation process is performed, as shown in FIG. 6.

Finally, as shown in FIG. 1, portions of the surfaces of the first n-type semiconductor layer 210, the first anode layer 310, the second n-type semiconductor layer 430, and the third n-type semiconductor layer 610 are exposed by a plurality of etching processes. Subsequently, an insulating layer 800 is formed to cover side surfaces of the respective sub-pixels, and a portion of the insulating layer 800 is etched, so that portions of the surfaces of the first n-type semiconductor layer 210, the first anode layer 310, and the first insulating layer 800 are exposed. Then, electrodes are formed by using a lift-off process.

In the present inventive concept, a unit pixel includes at least three sub-pixels stacked vertically. The anodes of all the sub-pixels are commonly connected to one terminal, and current flowing through each of the sub-pixels is controlled independently of each other. In addition, a unit pixel is grown in situ. This is a very highly efficient growth process.

In addition, the present inventive concept has a great advantage over the conventional method of implementing a unit pixel by arranging a red LED, a green LED, and a blue LED horizontally on a substrate. Three separate transfer processes are required to place each LED on a display substrate. For example, after placing red LEDs on a display substrate, green LEDs, and blue LEDs should be arranged in order. However, in the present inventive concept, since one pixel device includes all of red, green, and blue light sources, fabrication of a microdisplay is possible with just one transfer process.

In addition, when the conventional method is used in a transfer process, each LED constituting the sub-pixel has a high aspect ratio. For example, when a pixel having a size of 50 μm is to be formed, each sub-pixel should be horizontally disposed, and thus the size of the sub-pixel should have a size of about 10 μm or less. Transferring LEDs of a size less than 10 is not easy. On the other hand, in the present inventive concept, since the sub-pixels are stacked vertically, transfer is possible even with a pixel having a size of about 40 um.

In addition, when sub-pixels are arranged horizontally, a large pixel area is required, and color mixing is not natural. However, in the present inventive concept, since sub-pixels are arranged vertically, color mixing is easy, and thus the display is very easy to implement.

The invention claimed is:

1. A unit pixel of a microdisplay comprising:
   a first sub-pixel formed on a growth substrate and configured to emit light of a first wavelength;
   a common anode layer formed on the first sub-pixel and having n-type GaN;
   a second sub-pixel formed on the common anode layer and emitting light of a second wavelength longer than the first wavelength;
   a current blocking layer formed on the second sub-pixel and having a GaN-based compound semiconductor; and
   a third sub-pixel formed on the current blocking layer and emitting light of a third wavelength longer than the second wavelength,
   wherein the common anode layer comprises:
     a first anode layer to which a positive voltage is applied and having n-type GaN;
     a first tunnel junction layer disposed between the first anode layer and the first sub-pixel; and
     a second tunnel junction layer disposed between the first anode layer and the second sub-pixel,
     wherein the first tunnel junction layer comprises:
       a first highly n-doped layer formed on the first anode layer; and
       a first highly p-doped layer formed between the first highly n-doped layer and the first sub-pixel.

2. The unit pixel of claim 1, wherein the second tunnel junction layer comprises:

a second highly n-doped layer formed on the first anode layer; and a second highly p-doped layer formed between the second highly n-doped layer and the second sub-pixel.

3. The unit pixel of claim 1, wherein the current blocking layer is p-type GaN or GaN doped with a transition metal.

4. The unit pixel of claim 3, wherein the current blocking layer has GaN doped with Fe.

5. The unit pixel of claim 1, wherein the third sub-pixel comprises:

a third n-type semiconductor layer formed on the current blocking layer;

a third active layer formed on the third n-type semiconductor layer; and a third p-type semiconductor layer formed on the third active layer.

6. The unit pixel of claim 5, wherein the third sub-pixel further comprises a growth limiting layer formed on the current blocking layer, wherein the third n-type semiconductor layer is formed in lateral spaces between islands or empty spaces of a mesh formed by the growth limiting layer and grown based on the current blocking layer.

7. The unit pixel of claim 6, wherein the third n-type semiconductor layer has a textured surface with sharp shapes and inclined side surfaces.

8. The unit pixel of claim 7, wherein the third active layer is formed along a surface profile of the third n-type semiconductor layer.

9. The unit pixel of claim 6, wherein the growth limiting layer has SiNx and is formed as an island type or a mesh type.

10. The unit pixel of claim 5, wherein the current blocking layer comprises:

a growth limiting layer formed on the second sub-pixel; and a blocking semiconductor layer formed in lateral spaces between islands or empty spaces of a mesh formed by the growth limiting layer.

11. The unit pixel of claim 10, wherein the growth limiting layer has SiNx and is formed as an island type or a mesh type.

12. The unit pixel of claim 10, wherein the blocking semiconductor layer is p-type GaN or GaN doped with a transition metal.

13. The unit pixel of claim 10, wherein the blocking semiconductor layer is doped with Mg or Fe.

14. The unit pixel of claim 10, wherein the blocking semiconductor layer has sharp shapes and inclined side surfaces.

15. The unit pixel of claim 14, wherein the third n-type semiconductor layer is formed along a surface profile of the blocking semiconductor layer.

16. The unit pixel of claim 5, wherein the common anode layer and the third p-type semiconductor layer of the third sub-pixel are commonly connected to a common electrode.

17. A method of manufacturing a unit pixel of microdisplay comprising:

forming a first sub-pixel on a growth substrate to emit light of a first wavelength by using a GaN-based compound semiconductor;

forming a common anode layer having GaN on the first sub-pixel;

forming a second sub-pixel having GaN on the common anode layer and to emit light of a second wavelength longer than the first wavelength;

forming a current blocking layer having GaN on the second sub-pixel, and for blocking leakage current from or toward the second sub-pixel; and forming a third sub-pixel having GaN on the current blocking layer, and to emit light of a third wavelength longer than the second wavelength, wherein forming the third sub-pixel comprises:

forming a growth limiting layer having an island type or a mesh type on the current blocking layer;

forming a third n-type semiconductor layer in lateral spaces between islands or empty spaces of a mesh formed by the growth limiting layer based on an exposed current blocking layer;

forming a third active layer along a surface profile of the third n-type semiconductor layer; and forming a third p-type semiconductor layer on the third active layer.

18. The method of claim 17, wherein the third n-type semiconductor layer has sharp shapes and inclined side surfaces.

19. The method of claim 17, wherein the current blocking layer has SiNx.

20. The method of claim 17, wherein forming the current blocking layer comprises:

forming a growth limiting layer having SiNx, and having the island type or the mesh type on the second sub-pixel; and forming a current blocking semiconductor layer grown according to a crystal structure of the second sub-pixel in lateral spaces between islands or empty spaces of a mesh formed by the growth limiting layer.

21. The method of claim 20, wherein the blocking semiconductor layer has GaN doped with Mg or Fe.

22. The method of claim 17, further comprising:

performing a pixel isolation process by etching to expose a portion of a surface of the growth substrate after forming the third sub-pixel; and performing a heat treatment to discharge hydrogen atoms contained in p-type semiconductor layers through side surfaces exposed by the pixel isolation process.

* * * * *